United States Patent [19]
Greggain et al.

[11] Patent Number: 5,479,454
[45] Date of Patent: Dec. 26, 1995

[54] DIGITAL FILTER WITH IMPROVED NUMERICAL PRECISION

[75] Inventors: Lance Greggain, Woodbridge; Peter Mandl, Aurora, both of Canada

[73] Assignee: Genesis Microchip Inc., Markham, Canada

[21] Appl. No.: 124,201

[22] Filed: Sep. 21, 1993

[51] Int. Cl.$^6$ .............................. H04B 1/10; H03H 7/30
[52] U.S. Cl. .................... 375/350; 375/229; 364/724.03; 364/745
[58] Field of Search ................................ 375/11, 12, 14, 375/103, 229, 230, 232, 350; 348/160, 614, 600; 364/724.01, 724.16, 724.1, 724.03, 745, 760

[56] References Cited

U.S. PATENT DOCUMENTS

| | | | |
|---|---|---|---|
| 4,034,197 | 7/1977 | Lawrence et al. | 235/156 |
| 5,023,825 | 6/1991 | Luthra | 364/724.1 |
| 5,170,369 | 12/1992 | Rossum | 364/724.17 |
| 5,222,035 | 6/1993 | Nakase et al. | 348/614 |
| 5,262,974 | 11/1993 | Hansman et al. | 364/760 |
| 5,355,328 | 10/1994 | Arbeiter et al. | 364/724.1 |

*Primary Examiner*—Stephen Chin
*Assistant Examiner*—Tesfaldet Bogure
*Attorney, Agent, or Firm*—Staas & Halsey

[57] ABSTRACT

A digital filter characterized by a plurality of filter coefficients, positive ones of the coefficients being represented by unsigned binary integers and negative ones of the coefficients being represented by 2's complement binary integers, comprising an input for receiving a digital input signal comprising a first predetermined number of bits; means for truncating or rounding at least one leading "0" or trailing "0" of the positive ones of the coefficients and at least one leading "1" or trailing "0" of the negative ones of the coefficients, such that significance of the integers is removed; means for successively delaying the digital input signal to produce successively delayed versions of the digital input signal; means for multiplying the successively delayed versions of the digital input signal by respective ones of the truncated representations of the respective ones of the plurality of filter coefficients and in response generating a plurality of intermediate product integers; means for restoring significance to the intermediate product integers; and means for summing the intermediate product integers and in response generating a digital output signal.

12 Claims, 3 Drawing Sheets

DIGITAL FILTER WITH IMPROVED NUMERICAL PRECISION

FIELD OF THE INVENTION

This invention relates in general to digital filters, and more particularly to a digital filter with improved numerical precision.

BACKGROUND OF THE INVENTION

Digital filters have been in existence for many years, and a large amount of prior art is available both in the literature (Rabiner, L. R. and Gold, B. "Theory and Application of Digital Signal Processing", Prentice Hall 1975) as well as in issued patents (e.g. U.S. Pat. Nos. 4,063,060; 4,034,197 and 5,170,369).

Table 1, below, shows the significance of the results for an 8 bit multiplier and multiplicand depending upon whether the data is 2's complement or unsigned. Although 2's complement is not structured as sign and magnitude, Table 1 indicates that the first bit is a sign bit by using an "s" and the remaining data bits are indicated with a "d". Thus, an 8 bit 2's complement number can range from 127 (binary 01111111) to −128 (100000001). The 16 bit product is indicated as having two sign bits since the sign bits are always the same unless 1000000 is multiplied by 1000000. It is known in the art how to design filters that do not use 1000000 as a coefficient. The 8 most significant bits of the product are shown in Table 1 by bold type.

TABLE 1

| Binary Multiplication With Unsigned and 2's Complement Numbers | | | |
| --- | --- | --- | --- |
| Description | Multiplier | Multiplicand | Product |
| unsigned multiplier unsigned multiplicand | dddddddd | dddddddd | dddddddddddddddd |
| 2's Complement Multiplier unsigned multiplicand | sddddddd | dddddddd | sdddddddddddddddd |
| unsigned multiplier 2's Complement Multiplicand | dddddddd | sddddddd | sdddddddddddddddd |
| 2's Complement multiplier 2's Multiplier Multiplicand | sddddddd | sddddddd | ssdddddddddddddd* |

*unless both the multiplier and multiplicand are 10000000

Many digital filters use integer arithmetic rather than floating point arithmetic in order to simplify the construction of such filters. The use of integer numbers and integer arithmetic imposes a finite precision on the coefficients and data used in such filters. Increasing the precision of the coefficients allows the filter to better implement desired frequency response.

Digital filters are constructed with different number representations depending on the filter and data types. The most popular of these are unsigned binary and 2's complement, although other representations exist (e.g. sign and magnitude and 1's complement). Digital filters are generally constructed using one or the other system such that all of the coefficients, data and arithmetic elements adhere to the chosen number system. For example, using 2's complement representation and arithmetic, the filter coefficients may be considered as fractional unsigned numbers for positive numbers or fractional 2's complement numbers for negative numbers (although other abstractions and conceptual analysis may be used to obtain the same result). The filtered output signals are chosen to be the most significant bits that the filter produces. As discussed above, the filter may be designed to any precision by appropriate selection of coefficient word length. Intermediate and final results may be rounded or truncated to any smaller precision.

In prior art digital filters, the formatting of the input data to the filter as one of either 2's complement or unsigned binary integer changes the significance of the binary numbers that are produced by the multiplier within the filter. This requires that circuitry must be included to route the multiplier results from different locations depending upon whether the data is 2's complement or unsigned.

Traditional multipliers are available for implementing either integer or 2's complement arithmetic, but not both.

SUMMARY OF THE INVENTION

According to the present invention in its most general aspect, a digital filter is provided which is capable of implementing both 2's complement and integer arithmetic by utilizing only the most significant bits of the filter coefficients.

According to a preferred embodiment of the present invention, a digital filter is provided for implementing a decimation by a factor of 2, 4 or 8 in a vertical dimension of a video image, which digital filter is suitable for realization on a VLSI chip.

BRIEF DESCRIPTION OF THE DRAWINGS

A detailed description of the prior art and the preferred embodiment is provided herein below with reference to the following drawings, in which.

DETAILED DESCRIPTION OF THE PRIOR ART AND PREFERRED EMBODIMENT

Figure 1:
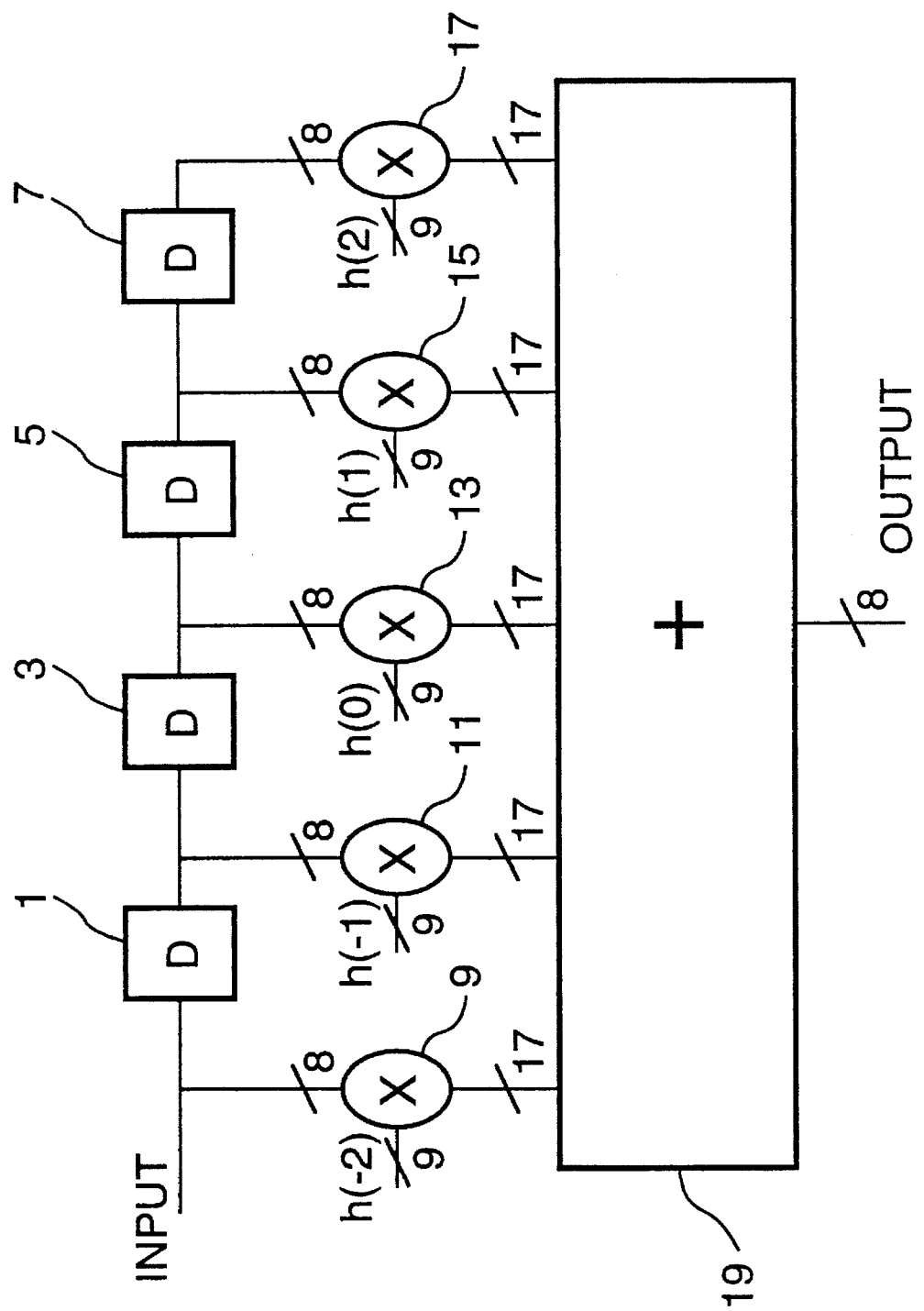
FIG. 1 is a block diagram showing the canonical form of a 5 tap digital filter according to the prior art.

Turning to FIG. 1, a canonical implementation of a 5 tap digital filter is shown. An 8 bit digital input signal is received and shifted through successive ones of a plurality of unit sample delay elements 1, 3, 5 and 7. Two-dimensional filters are characterized by different delays depending upon the direction of the filtering action. For horizontal filters, this corresponds to a pixel delay whereas, for vertical filters, this corresponds to a line delay.

The input data signals and the delayed input data signals from delay elements 1–7 are applied to respective multipliers 9, 11, 13, 15 and 17 for multiplication by respective 9 bit coefficients h(-2), h(1), h(0), h(1) and h(2). The maximum width of the product output of multipliers 9–17 is 17 bits in length.

The intermediate product signals are summed in binary summer 19 and the most significant 8 bits of the summation signal is generated as an output signal. The selection of the most significant 8 bits of output signal is effected via truncation or rounding.

According to the present invention, numerical precision in a digital filter is improved by truncating or rounding the multiplier coefficients prior to multiplication and shifting the resultant multiplier product values and utilizing sign extension for restoring significance of the product values. According to the present invention, the coefficients are represented as 2's complement numbers, positive integers being represented in the usual fashion as unsigned binary integers. However, according to the present invention, only the most significant bits of the coefficients are applied to the digital filter multipliers (e.g. multipliers 9–17 in the filter illustrated in FIG. 1). More particularly, leading 0's are deleted and trailing 0's are ignored for positive numbers. The leading 1's are deleted for 2's complement negative numbers and the trailing 0's are ignored. Finally, the multiplier results are shifted and sign extended in order to restore the significance of the product being produced.

For a unity gain digital filter, the sum of the coefficients is 1. Thus, for filters with large numbers of taps, the coefficients are smaller than for filters with smaller numbers of taps, in order that the sum of the filter coefficients is 1. Regardless of the gain of the filter, the technique of the present invention is applicable except that the sum of the coefficients may differ from 1.

Table 2 illustrates the filter coefficients for 5 tap, 9 tap, 17 tap, 33 tap and 65 tap Gaussian low pass filters. As can be seen from Table 2, for wide filters the leading bits in the positive coefficients are always 0 and the leading bits in the negative coefficients are always 1. By way of contrast, the trailing bits in the coefficients for narrow filters are all 0.

In the example shown in Table 2, six digits have been selected containing the greatest amount of data (i.e. "1" to "0" transitions) for a 6 bit multiplier. In the case of a 5 tap filter, the additional trailing 0's in the six-bit integer can also be discarded. However, for a multiplier with 6 bit resolution there is no benefit in doing so.

Thus, according to the principles of the present invention, the precision of the filter coefficients may be extended for a given size multiplier. In the examples of Table 2, the trailing 0's are discarded where they exceed the precision in the 5 tap case. In the 17 tap, 33 tap and 65 tap cases there are no trailing 0's to be discarded.

TABLE 2

| | Filter Coefficients | | | |
|---|---|---|---|---|
| Coefficient | 9 Bit 2's Complement Representation | 0 Integer 1 2's Comp | 6 bit Integer or 2's Complement Filter Coefficient | Shift Applied to Result |
| 5 Tap Decimating Half Band Filter | | | Trailing 0's Truncated | |
| h(0) | 010100000 | 0 | 101000 | 1R |
| h(1), h(−1) | 001000000 | 1 | 010000 | 1R |
| h(2), h(−2) | 111110000 | 1 | 111100 | 1R |
| 9 Tap Decimating Quarter Band Filter | | | | |
| h(0) | 001001110 | 0 | 100111 | 2R |
| h(1), h(−1) | 000111111 | 0 | 111111 | 3R |
| h(2), h(−2) | 000011110 | 1 | 011110 | 3R |
| h(3), h(−3) | 000000011 | 1 | 000011 | 3R |
| h(4), h(−4) | 111111001 | 1 | 111001 | 3R |
| 17 Tap Decimating ⅛th band Filter | | | Leading 0's or 1's Truncated | |
| h(0) | 000100110 | 0 | 100110 | 3R |
| h(1), h(−1) | 000100101 | 0 | 100101 | 3R |
| h(2), h(−2) | 000011111 | 1 | 011111 | 3R |
| h(3), h(−3) | 000010111 | 1 | 010111 | 3R |
| h(4), h(−4) | 000001111 | 1 | 001111 | 3R |
| h(5), h(−5) | 000000111 | 1 | 000111 | 3R |
| h(6), h(−6) | 000000001 | 1 | 000001 | 3R |
| h(7), h(−7) | 111111110 | 1 | 111110 | 3R |
| h(8), h(−8) | 111111101 | 1 | 111101 | 3R |
| 33 Tap Decimating 1/16th Band Filter | | | | |
| h(0) | 000010010 | 1 | 010010 | 3R |
| h(1), h(−1) | 000011000 | 1 | 011000 | 3R |

TABLE 2-continued

| | Filter Coefficients | | | |
|---|---|---|---|---|
| Coefficient | 9 Bit 2's Complement Representation | 0 Integer 1 2's Comp | 6 bit Integer or 2's Complement Filter Coefficient | Shift Applied to Result |
| h(2), h(−2) | 000010001 | 1 | 010001 | 3R |
| h(3), h(−3) | 000010000 | 1 | 010000 | 3R |
| h(4), h(−4) | 000001111 | 1 | 001111 | 3R |
| h(5), h(−5) | 000001101 | 1 | 001101 | 3R |
| h(6), h(−6) | 000001011 | 1 | 001011 | 3R |
| h(7), h(−7) | 000001001 | 1 | 001001 | 3R |
| h(8), h(−8) | 000000111 | 1 | 000111 | 3R |
| h(9), h(−9) | 000000101 | 1 | 000101 | 3R |
| h(10), h(−10) | 000000011 | 1 | 000011 | 3R |
| h(11), h(−11) | 000000010 | 1 | 000010 | 3R |
| h(12), h(−12) | 000000000 | 1 | 000000 | 3R |
| h(13), h(−13) | 000000000 | 1 | 000000 | 3R |
| h(14), h(−14) | 111111111 | 1 | 111111 | 3R |
| h(15), h(−15) | 111111111 | 1 | 111111 | 3R |
| h(16), h(−16) | 111111111 | 1 | 111111 | 3R |
| 65 Tap Decimating 1/32nd Band Filter | | | | |
| h(0) | 000001010 | 1 | 001010 | 3R |
| h(1), h(−1) | 000010000 | 1 | 010000 | 3R |
| h(2), h(−2) | 000001001 | 1 | 001001 | 3R |
| h(3), h(−3) | 000001001 | 1 | 001001 | 3R |
| h(4), h(−4) | 000001000 | 1 | 001000 | 3R |
| h(5), h(−5) | 000001000 | 1 | 001000 | 3R |
| h(6), h(−6) | 000001000 | 1 | 001000 | 3R |
| h(7), h(−7) | 000001000 | 1 | 001000 | 3R |
| h(8), h(−8) | 000000111 | 1 | 000111 | 3R |
| h(9), h(−9) | 000000111 | 1 | 000111 | 3R |
| h(10), h(−10) | 000000110 | 1 | 000110 | 3R |
| h(11), h(−11) | 000000110 | 1 | 000110 | 3R |
| h(12), h(−12) | 000000101 | 1 | 000101 | 3R |
| h(13), h(−13) | 000000101 | 1 | 000101 | 3R |
| h(14), h(−14) | 000000100 | 1 | 000100 | 3R |
| h(15), h(−15) | 000000100 | 1 | 000100 | 3R |
| h(16), h(−16) | 000000011 | 1 | 000011 | 3R |
| h(17), h(−17) | 000000011 | 1 | 000011 | 3R |
| h(18), h(−18) | 000000010 | 1 | 000010 | 3R |
| h(19), h(−19) | 000000010 | 1 | 000010 | 3R |
| h(20), h(−20) | 000000001 | 1 | 000001 | 3R |
| h(21), h(−21) | 000000001 | 1 | 000001 | 3R |
| h(22), h(−22) | 000000001 | 1 | 000001 | 3R |
| h(23), h(−23) | 000000000 | 1 | 000000 | 3R |
| h(24), h(−24) | 000000000 | 1 | 000000 | 3R |
| h(25), h(−25) | 000000000 | 1 | 000000 | 3R |
| h(26), h(−26) | 000000000 | 1 | 000000 | 3R |
| h(27), h(−27) | 000000000 | 1 | 000000 | 3R |
| h(28), h(−28) | 000000000 | 1 | 000000 | 3R |
| h(29), h(−29) | 000000000 | 1 | 000000 | 3R |
| h(30), h(−30) | 000000000 | 1 | 000000 | 3R |
| h(31), h(−31) | 000000000 | 1 | 000000 | 3R |
| h(32), h(−32) | 000000000 | 1 | 000000 | 3R |

The step of switching between a 2's complement and unsigned multiplier corresponds to shifting the significance of the generated product. The centre tap coefficient in a low pass digital filter is always positive and always is the largest coefficient. For the 5 tap example illustrated in Table 2, storing the largest filter coefficient as a 6 bit positive number allows the filter to have 9 bit effective digital filter coefficients.

The shift and sign extension step shown in relation to the 9 tap, 17 tap, 33 tap and 65 tap filters effectively restores the significance of the data after the multiplication has taken place.

In a case where the input data contains leading 0's (positive numbers) or leading 1's (negative numbers), the 6 most significant digits can be selected. Significance of the 2's complement product is restored by right shifting the results with sign extension. This technique utilizes the significance of the product to extend the effective precision of the input data.

Figure 2:
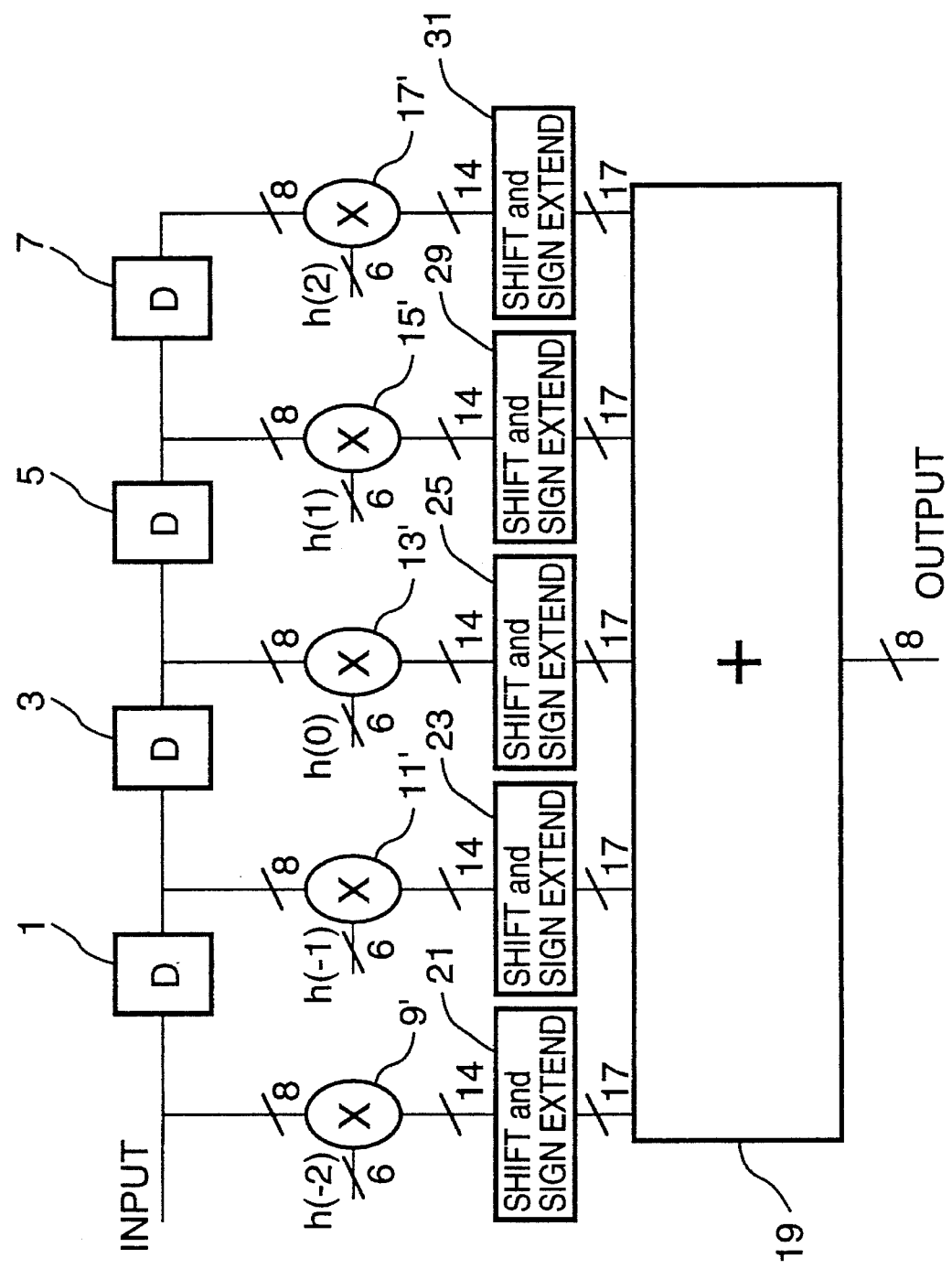
FIG. 2 is a block diagram showing the canonical form of a 5 tap filter according to the present invention.

Turning now to FIG. 2, a block diagram is provided for schematically illustrating the implementation of this invention for a 5 tap filter, according to the present invention.

The unit delay elements 1–7 and summer 19 are the same as in the prior art digital filter illustrated in FIG. 1. However, according to the implementation of FIG. 2, the width of the multipliers 9', 11', 13', 15' and 17' has been reduced to accommodate the truncated 6 bit filter coefficients h(-2), h(-1), h(0) h(1) and h(2), for generating 14 bit intermediate product signals. The sign input to multipliers 9', 11', 13', 15' and 17' is used to distinguish between signed and unsigned 2's complement coefficients.

As discussed above in connection with Table 2, the 14 bit intermediate product signals are shifted and sign extended via circuit elements 21–31 to provide the desired 17 bit resolution of the product signals applied to summer 19. In the 5 tap embodiment discussed with reference to Table 2, only a one-bit shift and sign extension are employed, in the 9 tap embodiment a two-bit shift and sign extension are employed for the center tap, while for the remaining taps, and for the 17 tap, 33 tap and 65 tap embodiments, both sign extension and three-bit shifting of the results are applied. The sign extension and shift blocks 21–31 may be implemented using registers, memory, etc, in a well known manner.

Figure 3:
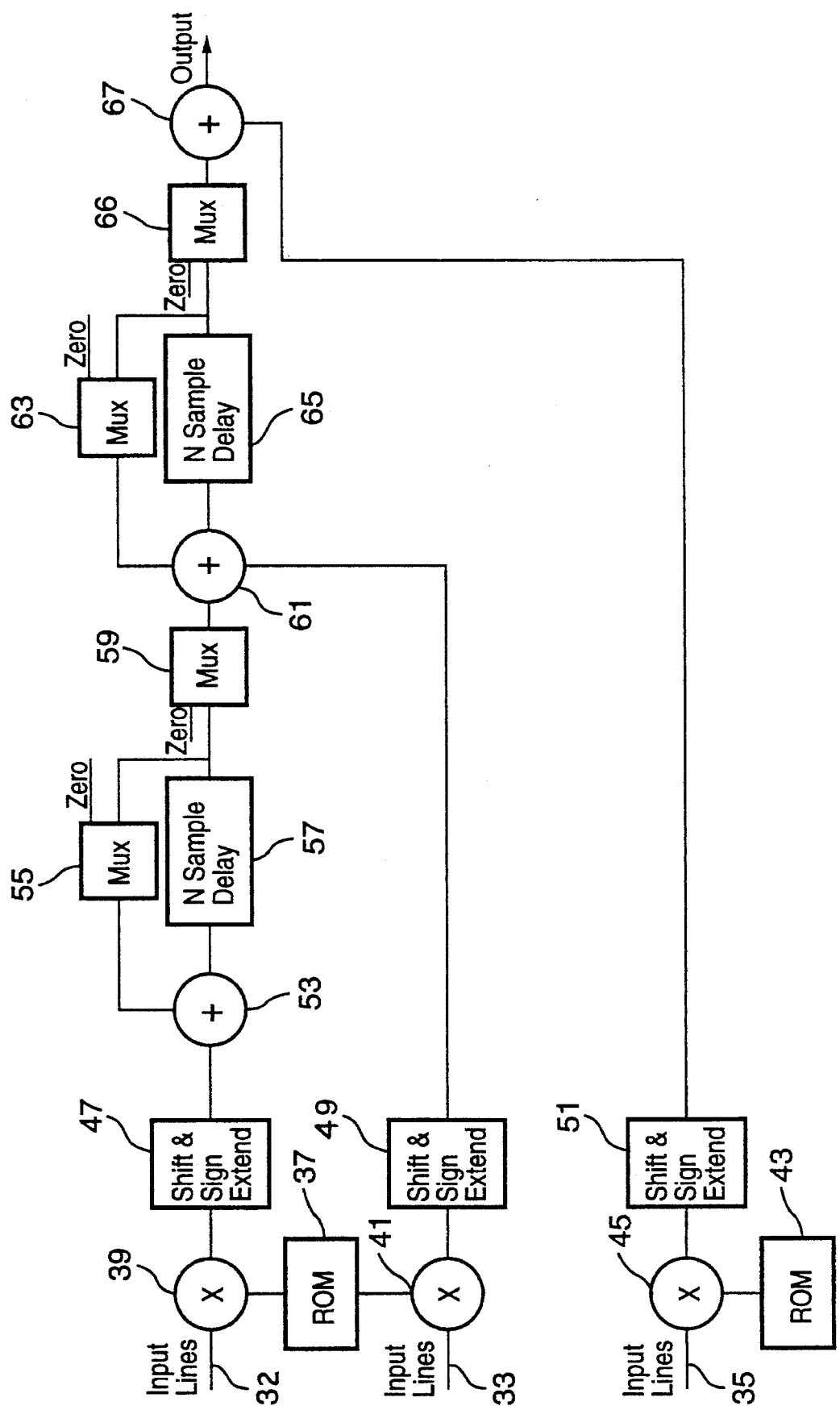
FIG. 3 is a block diagram of the preferred embodiment of a 5-tap digital filter using improved numerical precision according to the present invention, as implemented in the down sampling portion of a video image resizing engine.

According to the preferred embodiment of FIG. 3, a circuit is provided for implementing the 5-tap filter discussed above with reference to Table 2, for providing decimation in the down-sampling portion of a video image resizing engine. The filter structure of FIG. 3 has been implemented as an integrated circuit utilizing the decimating filter apparatus described in U.S. patent application Ser. No. 07/766,128. However, according to the present invention, the filter coefficients are truncated and stored along with the sign bits, for reducing the amount of coefficient data to be stored. Sign extension is utilized and one of either 2's complement or unsigned binary integers are also utilized depending upon the need to increase precision, for providing improved numerical accuracy.

Turning to FIG. 3, there is shown a 5-tap decimating filter for providing decimation by a factor of 2, 4 or 8. Input line 32 carries video signal sample values from successive input lines L1, L2 . . . L6, L7 . . . etc. which form the relatively long scan-line sampling periods in the vertical direction of a video image. Thus, L1, L2 . . . L7 and L8 represent eight successive relatively long horizontal scan lines of the video image (with each scan line comprising a large number of pixel sample values). Thus, starting with input line L1, multiplier 39 receives, in turn, as a multiplicand each of all the successive input lines L1, L2 . . . L6, L7 . . . of sample values, and receives as a multiplier one of the truncated 6-bit filter coefficients h(-2) or h(-1) from ROM 37 (see Table 1 of the truncated kernel function coefficients). Starting with input line L3, multiplier 41 receives, in turn, as a multiplicand each of the successive input lines L3, L4 . . . L8, L9 . . . of sample values, and receives as a multiplier one of the truncated 6-bit filter coefficients h(1) or h(0) from ROM 37. Starting with input line L5, multiplier 45 receives, in turn, as a multiplicand each of the successive odd-numbered input lines L5, L7, L9 . . . of sample values, and receives as a multiplier the truncated 6-bit filter coefficient h(2). In general, each of the successive input lines L1 . . . L9 . . . comprises N sample values, where N may be any positive integer. However, for illustrative purposes, it is assumed that each of these successive input lines is a scan line of a video image, occupying a scan-line period, and N is the number of pixel sample values in such a scan line.

As discussed above with reference to FIG. 2, the 14 bit output of multiplier 39 is shifted and sign extended to restore significance to the intermediate product integers output from multiplier 39 via shift and sign extend circuit 47.

The output of shift and sign extend circuit 47 is applied as a first input to summer 53 and the output of summer 53 is applied as an input to first N-sample delay circuit 57. The output of the first N-sample delay circuit 57 is applied both as a first input to multiplexer 55 and as a first input to multiplexer 59. A zero value is applied as a second input to both multiplexers 55 and 59. The output of multiplexer 55 is applied as a second input to summer 53 and the output of multiplexer 59 is applied as a first input to summer 61. The output from multiplier 41 is shift and sign extended via circuit 49 as discussed above, and the output of the shift and sign extend circuit 49 is applied as a second input to summer 61. The output of summer 61 is applied as an input to a second N-sample delay circuit 65. The output from the second N-sample delay circuit 65 is applied as a first input to multiplexer 63, and as a first input to an additional multiplexer 66.

A zero value is applied as a second input to each of multiplexers 63 and 66. The output from multiplexer 63 is applied as a third input to summer 61 and the output from multiplexer 66 is applied as a first input to summer 67. The output from multiplier 45 is shifted and sign extended via circuit 51, and the shifted and sign extended intermediate product signal output from circuit 51 is applied as a second input to summer 67. The output from summer 67 comprises the octave prefilter decimated output signal.

In addition to the structure shown in FIG. 3, each multiplier and summer includes an individual sample latch (not shown) at each of its inputs and at its outputs, with each latch introducing a one sample delay in the flow of data. Further, in practice, suitable timing and control circuitry (not shown) is provided for controlling the flow of data through the octave prefilter structure of FIG. 3 as discussed presently.

The settings of multiplexers 55 and 63 are such that the respective outputs of first and second N-sample delay circuits 57 and 65 are recirculated only during even input-line scan-line period cycles of operation and zero values are normally recirculated during all odd input-line scan-line period cycles of operation. (Although in principle, it is not absolutely essential that multiplexers 55 and 63 be in their zero value stage during those odd input-line scan-line period cycles of operation, such as during the initial cycle, where it is known a priori that no sample values can be emerging from the respective outputs of the first and second N-sample delay circuits 57 and 65.) The setting of multiplexers 59 and 66 is such that the outputs of N-sample delay circuits 57 and 65 are translated respectively therethrough to the inputs of summers 61 and 67 only during odd input-line scan-line period cycles of operation and zero values are translated therethrough to the first inputs of summers 61 and 67 during even input-line scan-line period cycles of operation.

For the purpose of the following discussion, corresponding sample values of the respective input lines L1, L2, L3 . . . are designated sL1, sL2, sL3 . . . , respectively. During the first scan-line period cycle of operation of the filter, each of the N samples of input line L1 is first multiplied by coefficient h(-2), to provide a sample value h(-2)s L1 and then each of these sample values is shifted and sign extended via circuit 47 to restore significance to the product signal and then applied through summer 53 as an input to the first N-sample delay means 57.

During the second scan-line period cycle of operation, multiplexer 55 is in its non-zero state, so that the sample values h(-2) sL1 now emerging as an output from the N-sample delay circuit 57 are recirculated back as a second input to summer 53 and are added to the corresponding h(-1) sL2 samples now being applied as a first input to summer 53

(ie ROM 37 generates the appropriate truncated 6-bit kernel-function weighting coefficient which is multiplied by the N samples of the second input line L2 in multiplier 39 and shifted and sign extended via circuit 47). Therefore, during the second scan-line period cycle of operation, the sample Value of each sample applied as an input to the first N-sample delay circuit 57 is h(-2) sL1+h(-1) sL2. However, during the second scan-line period cycle of operation, multiplexer 59 is in its zero state, so that the h(-2) sL1 value output from delay circuit 57 is not applied to the first input of summer 61.

During the third scan-line period cycle of operation, both multiplexers 55 and 63 are in their zero state, so that no recirculation takes place of the h(-2) sL1+h(-1) sL2 valued samples output from the first N-sample delay circuit 57 to the summer 53. However, multiplexer 59 is now in its non-zero state, so that the h(-2) sL1+h(-1) sL2 valued samples output from delay circuit 57 are forwarded through multiplexer 59 to the first input of summer 61. Thus, during the third scan-line period cycle of operation, h(-2) sL1+h(-1) sL2+h(0) sL3 valued samples are applied as an input to the second N-sample delay circuit 65 (i.e. ROM 37 generates the h(0) kernel function weighting coefficient in 6-bit truncated form, which is multiplied by the N-samples of input scan-line L3 via multiplier 41, the intermediate product signal output of which is shifted and sign extended via circuit 49 and applied to summer 61).

During the fourth scan-line period cycle of operation, both multiplexers 55 and 63 are in the nonzero state, so that recirculation takes place of the h(-2) sL1+h(-1) sL2+h(0) sL3 valued samples being output from the second N-sample delay circuit 65 back to the summer 61 as a third input thereto. Furthermore, ROM 37 generates the 6-bit truncated kernel function weighting coefficient h(1) for multiplication by the N-samples of input line L4 via multiplier 41. The intermediate product signal output from multiplier 41 is shifted and sign extended via circuit 49 and applied to summer 61 so that the output of summer 61 generates a summation of samples h(-2) sL1+h(-1) sL2+h(0) sL3+h(1) sL4. This summation of samples is now applied to the input of N-sample delay circuit 65. However, multiplexers 59 and 66 are now in the zero state, so that while the h(-2) sL3 valued samples now emerging from the output of the first N-sample circuit 57 are recirculated back to the second input of summer 53, these h(-2) sL3 valued samples are not forwarded to the first input of summer 61, and the h(-2) sL1+h(-1) sL2+h(0) sL3 valued samples now emerging as an output from second N-sample delay circuit 65 are not forwarded to the first input of summer 67. The recirculated h(-2) sL3 valued samples are now added to the h(-1) sL4 valued samples in summer 53 and the resulting h(-2) sL3+h(-1) sL4 valued samples are applied to the input of first N-sample delay circuit 57.

During the fifth scan-line period cycle of operation, both of multiplexers 55 and 63 are in their zero state, so that no recirculation takes place of the h(-2) sL3+h(-1) sL4 valued samples now emerging as an output from first N-sample delay circuit 57 back as a second input to summer 53. However, now multiplexers 59 and 66 are in the non-zero state, so that the h(-2) sL3+h(-1) sL4 valued samples are forwarded through multiplexer 59 to the first input of summer 61 and the h(-2) sL1+h(-1) sL2+h(0) sL3+ h(1) sL4 valued samples now emerging from the second N-sample delay circuit 65 are applied to the first input of summer 67. Further, ROM 43 generates 6-bit truncated kernel-function weighting coefficient h(2) which is multiplied by the N-samples of scan-line 15 and multiplier 45, the intermediate product signal output of which is shifted and sign extended via circuit 51 and applied as a second input to summer 67, thereby deriving a first filtered output line comprising h(-2) sL1+h(-1) sL2+h(0) sL3+h(1) sL4+ h(2) sL5 valued samples, from the first 5-tap octave prefilter structure of FIG. 3.

It will be noted that the status of the h(-2) sL3+h(-1) sL4 valued samples during the fifth scan-line period cycle of operation is identical to the status of the h(-2) sL1+h(-1) sL2 valued samples during the third scan-line period cycle of operation. Thus, the sixth and seventh scan-line period cycles of operation will correspond, respectively, to the fourth and fifth scan-line period cycles of operation. Therefore, the second filtered output line, comprising h(-2) sL3+ h(-1) sL4+h(0) sL5+h(1) sL6+h(2) sL7 valued samples, will be derived in the seventh scan-line period cycle of operation. In a similar manner, the third filtered output line comprising h(-2) sL5+ h(-1) sL6+h(0) sL7+h(1) sL8+h(2) sL9 valued samples, will be derived in the ninth scan-line period cycle of operation while the fourth filtered output line, comprising h(-2) sL7+h(-1) sL8+h(0) sL9+ h(1) sL10+h(2) sL11 valued samples, will be derived in the eleventh scan-line period cycle of operation, and so forth.

From the above discussion, it can be seen that filtered output lines occur only for each successive odd scan-line period cycle of operation, starting with the fifth scan-line period cycle of operation. Therefore, decimation by a factor of two has taken place between the input and output lines of the first 5-tap octave prefilter structure of the present invention shown in FIG. 3.

The structure of FIG. 3 may be used to implement a 9 tap, 17 tap, 33 tap, 65 tap, etc. structure by applying the appropriate truncated kernel-function weighting coefficients from ROMs 37 and 43 to multipliers 39, 41 and 45 in accordance with the appropriate timing control. The truncated intermediate product signals output from multipliers 39, 41 and 45 are shifted and sign extended via circuits 47, 49 and 51 in the manner discussed above.

As an example, implementation of the circuit of FIG. 3 as a 9-tap decimating filter is discussed herein below. ROM 37 operates cyclicly to forward each of the four kernel-function weighting coefficients h(-4), h(-3), h(-2) and h(-1), in turn, to the multiplier input of multiplier 39. ROM 37 also operates cyclicly to forward each of the four kernel-function weighting coefficients h(0), h(1), h(2), and h(3), in turn, to the multiplier input of multiplier 41. Further, ROM 43 generates the truncated kernel-function weighting coefficient h(4) and directly applies it to the input of multiplier 45.

Besides this difference in physical structure, there are the following differences in signal timing and control between that employed by the circuit of FIG. 3 for implementing a 5-tap filter and that employed when implementing a 9-tap filter. In the 9-tap filter implementation, starting with input line L5, every input line is applied to the multiplicand input of multiplier 41, and, starting with input line L9, every fourth input line (i.e. L13, L17 . . . ) is applied to the multiplicand input of multiplier 45. Further, the timing control of multiplexers 55 and 63 is such that they are in their zero state only during scan-line period cycles of operational 1, 5, 9, 13 . . . and are in their non-zero state during all other scan-line period cycles of operation; while the timing control of multiplexers 59 and 66 is such that they are in the non-zero state only during scan-line period cycles of operation 1, 5, 9, 13 . . . and are in the zero state during other scan-line period cycles of operation.

In the operation of FIG. 3 for implementing a 9-tap decimating filter, the h(-4) sL1 valued samples are applied to the input of the first N-sample delay circuit 57 during the first scan-line period cycle of operation. During each of the second through fourth scan-line period cycles of operation, successive older recirculated sample values emerging as an output from the first N-sample delay circuit 57, that are applied to the second input of summer 53, are added to new sample values that are applied to the first input of summer 53 (in the manner described above in connection with the 5-tap decimating filter implementation of FIG. 3). This results in h(-4) sL1+h(-3) sL2+h(-2) sL3+h(-1) sL4 valued samples being applied to the input of first N-sample delay circuit 57 during the fourth scan-line period cycle of operation. However, when these h(-4) sL1+h(-3) sL2 h(-2) sL3+ h(-1) sL4 valued samples emerge as an output from the first N-sample delay circuit 57 during the fifth scan-line period cycle of operation, multiplexer 55 is in its zero state and multiplexer 59 is in its non-zero value state. Therefore, these h(-4) sL1+h(-3) sL2+h(-2) sL3+h(-1) sL4 valued samples are forwarded to the first input of summer 61, where they are added to h(0) sL5 valued samples applied to the second input of summer 61 before being applied as an input to second N-sample delay circuit 65.

During each of the scan-line period cycles of operation 6 to 8, in which successive older recirculated sample values emerging as an output from second N-sample delay means 65, that are applied to the third input of summer 61, are added to new sample values that are applied to the second input of summer 61 results in h(-4) sL1+h(-3) sL2+h(-2) sL3+h(-1) sL4+h(0) sL5+h(1) sL6+h(2) sL7+h(3) sL8 being applied to the input of second N-sample delay circuit 65 during the eighth scan-line period cycle of operation. However, when these samples emerge as an output from the second N-sample delay circuit 65 during the ninth scan-line period cycle of operation, multiplexers 59 and 66 are in the non-zero value state. Therefore, these sample values are forwarded to the first input of summer 67, where they are added to the h(4) sL9 valued samples that are applied to the second input of summer 67. This results in the value of samples from the output of summer 67, which constitutes a first filtered output pixel line, being h(-4) sL1+h(-3) sL2+ h(-2) sL3+h(-1) sL4+h(0) sL5+h(1) sL6+h(2) sL7+h(3) sL8+h(4) sL9.

In a similar manner, the value of samples constituting the second filtered output line is h(-4) sL5+h(-3) sL6+h(-2) sL7+h(-1) sL8+h(0) sL9+ h(1) sL10+h(2) sL11+h(3) sL12+ h(4) sL13; and so forth.

From the above discussion, it is clear that filtered output lines occur only for each successive fourth scan-line period cycle of operation, starting with the ninth scan-line period cycle of operation. Therefore, decimation by a factor of four has taken place between the input and output lines of the 9-tap octave prefilter structure implementation of FIG. 3.

With reference again to Table 2, it will be noted that a change between 2's complement and unsigned binary filter coefficients has been used only when required to maintain the significance of all of the filters so that the user can change from one to the other without any changes to the average intensity of the filtered image that is produced. The 5, 9 and 17 tap filters incorporate a change between 2's complement and unsigned binary numbers to improve the overall accuracy of the filters. It should also be noted that the filters are implemented in both vertical and horizontal directions.

The pseudo-floating point filter coefficients are multiplied by the input data at reduced precision and the results are shifted and sign extended to compensate for the bit truncation. This reduces the quantity of data stored where the coefficients are stored in memory, and reduces the complexity of the arithmetic required to obtain the exact result. It is contemplated that the filter coefficients may be hard wired (fixed coefficients that are connected to logic high or logic low voltages on a bit-by-bit basis), stored in RAM or ROM, loaded from a host, or calculated.

In summary, according to the present invention, a digital filter design methodology is provided in which the filter coefficients are truncated to an appropriate size by dropping leading 0's and trailing 0's for positive numbers and leading 1's and trailing 0's for negative 2's complement numbers. It should be noted that for negative 2's complement numbers at least one leading 1 or leading 0 must be retained. The product must be right shifted 1 bit for every 2's complement leading 1 that is truncated. For integer operation, the product is right shifted once to compensate for the use of non 2's complement arithmetic, and once for every leading 0 that is truncated. As indicated above, the technique of the present invention can be used with both 2's complement and unsigned binary arithmetic. In this regard, positive numbers can be represented as 2's complement numbers with leading 0's truncated until only one leading 0 remains. In this case, the product must be right shifted by one bit for each leading 0 that is truncated from the coefficient.

The system of the present invention allows for the design of a digital filter with extended precision of the filter coefficients given a particular size of multiplier. By minimizing the width of the multipliers, the filter may be caused to operate at increased speed using less semiconductor real estate.

Other embodiments and variations of the invention are possible within the sphere and scope of claims appended hereto.

I claim:

1. A digital filter characterized by a plurality of filter coefficients, positive ones of said coefficients being represented by unsigned binary integers and negative ones of said coefficients being represented by 2's complement binary integers, comprising:

a) an input for receiving a digital input signal comprising a first predetermined number of bits;

b) means for providing one of either truncated or rounded coefficients by truncating or rounding at least one leading "0" or trailing "0" of said positive ones of said coefficients and at least one leading "1" or trailing "0" of said negative ones of said coefficients, such that significance of said integers is removed;

c) means for successively delaying said digital input signal to produce successively delayed versions of said digital input signal;

d) means for multiplying said successively delayed versions of said digital input signal by respective ones of said truncated representations of said respective ones of said plurality of filter coefficients and in response generating a plurality of intermediate product integers;

e) means for restoring significance to said intermediate product integers; and f) means for summing said intermediate product integers having restored significance and in response generating a digital output signal.

2. The digital filter of claim 1, wherein said means for providing one of either truncated or rounded coefficients comprises a digital memory for storing said coefficients encoded in truncated form.

3. The digital filter of claim 1, wherein said means for successively delaying comprises a plurality of series connected unit delay elements.

4. The digital filter of claim 3, wherein said means for multiplying further comprises a plurality of digital multipliers.

5. The digital filter of claim 1, wherein said means for restoring significance comprises means for sign extending and shifting said intermediate product integers rightward.

6. The digital filter of claim 2, wherein said digital memory stores three 6-bit truncated coefficients for implementing a 5-tap decimating half band filter, as follows: h(0)=101000; h(1), h(-1)= 010000 and h(2), h(-2)=111100, and wherein said means for restoring significance comprises means for sign extending and shifting said intermediate product integers 1 bit rightward.

7. The digital filter of claim 2, wherein said digital memory stores a first truncated 6-bit filter coefficient and further truncated 6-bit filter coefficients for implementing a 9-tap decimating quarter band filter, wherein said first truncated filter coefficient comprises h(0)=100111, and said further truncated filter coefficients comprise h(1), h(-1)= 111111; h(2), h(-2)=011110; h(3), h(-3)= 000011 and h(4), h(-4)=111001, and wherein said means for restoring significance to said intermediate product integers in respect of a first one of said intermediate product integers comprises means for sign extending and shifting said first intermediate product integer 2 bits rightward, and wherein said means for restoring significance to additional ones of said intermediate product integers comprises means for sign extending and shifting said additional intermediate product integers three bits rightward.

8. The digital filter of claim 2, wherein said means for restoring significance comprises means for sign extending and shifting said intermediate product integers 3 bits rightward, and wherein said coefficients are encoded in truncated form within said digital memory for effecting a 17-tap decimating ⅛th band filter as follows:

| h(0) | = | 100110 |
|---|---|---|
| h(1), h(-1) | = | 100101 |
| h(2), h(-2) | = | 011111 |
| h(3), h(-3) | = | 010111 |
| h(4), h(-4) | = | 001111 |
| h(5), h(-5) | = | 000111 |
| h(6), h(-6) | = | 000001 |
| h(7), h(-7) | = | 111110 |
| h(8), h(-8) | = | 111101 |

9. The digital filter of claim 2, wherein said means for restoring significance comprises means for sign extending and shifting said intermediate product integers 3 bits rightward, and wherein said coefficients are encoded in truncated form within said digital memory for effecting a 33-tap decimating 1/16th band filter as follows:

| h(0) | = | 010010 |
|---|---|---|
| h(1), h(-1) | = | 011000 |
| h(2), h(-2) | = | 010001 |
| h(3), h(-3) | = | 010000 |
| h(4), h(-4) | = | 001111 |

-continued

| h(5), h(-5) | = | 001101 |
|---|---|---|
| h(6), h(-6) | = | 001011 |
| h(7), h(-7) | = | 001001 |
| h(8), h(-8) | = | 000111 |
| h(9), h(-9) | = | 000101 |
| h(10), h(-10) | = | 000011 |
| h(11), h(-11) | = | 000010 |
| h(12), h(-12) | = | 000000 |
| h(13), b(-13) | = | 000000 |
| h(14), h(-14) | = | 111111 |
| h(15), h(-15) | = | 111111 |
| h(16), h(-16) | = | 111111 |

10. The digital filter of claim 2, wherein said means for restoring significance comprises means for sign extending and shifting said intermediate product integers 3 bits rightward, and wherein said coefficients are encoded in truncated form within said digital memory for effecting a 65-tap decimating 1/32nd band filter as follows:

| h(0) | = | 001010 |
|---|---|---|
| h(1), h(-1) | = | 010000 |
| h(2), h(-2) | = | 001001 |
| h(3), h(-3) | = | 001001 |
| h(4), h(-4) | = | 001000 |
| h(5), h(-5) | = | 001000 |
| h(6), h(-6) | = | 001000 |
| h(7), h(-7) | = | 001000 |
| h(8), h(-8) | = | 000111 |
| h(9), h(-9) | = | 000111 |
| h(10), h(-10) | = | 000110 |
| h(11), h(-11) | = | 000110 |
| h(12), h(-12) | = | 000101 |
| h(13), h(-13) | = | 000101 |
| h(14), h(-14) | = | 000100 |
| h(15), h(-15) | = | 000100 |
| h(16), h(-16) | = | 000011 |
| h(17), h(-17) | = | 000011 |
| h(18), h(-18) | = | 000010 |
| h(19), h(-19) | = | 000010 |
| h(20), h(-20) | = | 000001 |
| h(21), h(-21) | = | 000001 |
| h(22), h(-22) | = | 000001 |
| h(23), h(-23) | = | 000000 |
| h(24), h(-24) | = | 000000 |
| h(25), h(-25) | = | 000000 |
| h(26), h(-26) | = | 000000 |
| h(27), h(-27) | = | 000000 |
| h(28), h(-28) | = | 000000 |
| h(29), h(-29) | = | 000000 |
| h(30), h(-30) | = | 000000 |
| h(31), h(-31) | = | 000000 |
| h(32), h(-32) | = | 000000 |

11. For use in a digital filter in which successively delayed samples of an input signal are multiplied by successive filter coefficients to create intermediate product signals which are then summed to form an output signal, a method of improving numerical precision comprising the steps of:

a) deleting one of either leading 0's or trailing 0's of positive ones of said coefficients and deleting one of either leading 1's or trailing 0's of negative ones of said coefficients prior to multiplication by said successively delayed samples of said input signal, such that significance of said integers is removed; and b) shifting and sign extending said intermediate product signals prior to said product signals being summed, in order to restore significance to said intermediate product signals.

12. For use in a digital filter in which successively delayed samples of an input signal are multiplied by successive filter coefficients to create intermediate product signals which are then summed to form an output signal, apparatus for improving numerical precision comprising:

a) means for deleting one of either leading 0's or trailing 0's of positive ones of said coefficients and deleting one of either leading 1's or trailing 0's of negative ones of said coefficients prior to multiplication by said successively delayed samples of said input signal, such that significance of said integers is removed; and b) means for shifting and sign extending said intermediate product signals prior to said product signals being summed, in order to restore significance to said intermediate product signals.

* * * * *